(12) United States Patent
Guillemette

(10) Patent No.: US 10,548,158 B2
(45) Date of Patent: Jan. 28, 2020

(54) MESSAGE PASSING ALGORITHM DECODER AND METHODS

(71) Applicant: Philippe Guillemette, Stittsville (CA)

(72) Inventor: Philippe Guillemette, Stittsville (CA)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 640 days.

(21) Appl. No.: 15/066,766

(22) Filed: Mar. 10, 2016

(65) Prior Publication Data

US 2017/0265213 A1 Sep. 14, 2017

(51) Int. Cl.
*H04W 72/12* (2009.01)
*H04W 72/04* (2009.01)
*H04W 72/08* (2009.01)

(52) U.S. Cl.
CPC ... *H04W 72/1231* (2013.01); *H04W 72/0433* (2013.01); *H04W 72/0453* (2013.01); *H04W 72/0473* (2013.01); *H04W 72/082* (2013.01)

(58) Field of Classification Search
None
See application file for complete search history.

(56) References Cited

U.S. PATENT DOCUMENTS

| 8,890,722 B2* | 11/2014 | Salvekar | H04L 1/005 341/107 |
| 2003/0033575 A1* | 2/2003 | Richardson | G06N 3/02 714/799 |
| 2005/0172209 A1* | 8/2005 | Cameron | H03M 13/1117 714/794 |
| 2005/0204271 A1* | 9/2005 | Sharon | H03M 13/1117 714/801 |
| 2005/0204272 A1* | 9/2005 | Yamagishi | H03M 13/1111 714/801 |
| 2005/0257116 A1* | 11/2005 | Zarrinkhat | H03M 13/1105 714/755 |
| 2006/0190797 A1* | 8/2006 | Xin | H03M 13/1105 714/758 |
| 2007/0210941 A1* | 9/2007 | Park | H03M 13/1111 341/50 |

(Continued)

FOREIGN PATENT DOCUMENTS

| WO | 2014090205 A1 | 6/2014 |
| WO | 2016000197 A1 | 7/2016 |

OTHER PUBLICATIONS

Sharon, Eran, et al., "Efficient Serial Message-Passing Schedules for LDPC Decording", IEEE Transactions of Information Theory, vol. 53, No. 11, Nov. 2007.

*Primary Examiner* — Hassan A Phillips
*Assistant Examiner* — Gautam Sharma

(57) ABSTRACT

Methods and devices are disclosed for receiving and detecting sparse data sequences using a message passing algorithm (MPA) with early propagation of belief messages. Such data sequences may be used in wireless communications systems supporting multiple access, such as sparse code multiple access (SCMA) systems. The determination and passing of one or more messages for an edge between a function node and a variable node in a factor graph representation of the system may be performed in serial with determined values available early for subsequent computations. The serial computations may be scheduled based on various factors.

20 Claims, 8 Drawing Sheets

(56) References Cited

U.S. PATENT DOCUMENTS

| | | | |
|---|---|---|---|
| 2007/0220398 A1* | 9/2007 | Moon | H03M 13/1131 714/758 |
| 2008/0270868 A1* | 10/2008 | Shinagawa | H03M 13/1111 714/752 |
| 2009/0158115 A1* | 6/2009 | Bae | H03M 13/1102 714/752 |
| 2009/0187802 A1* | 7/2009 | Yamagishi | H03M 13/1111 714/752 |
| 2009/0259912 A1 | 10/2009 | Djordjevic et al. | |
| 2010/0080289 A1* | 4/2010 | Jeon | H04N 19/46 375/240.03 |
| 2011/0087946 A1* | 4/2011 | Planjery | H03M 13/1117 714/752 |
| 2014/0269663 A1 | 9/2014 | Nikopour et al. | |
| 2014/0328380 A1* | 11/2014 | Pustovalov | H04L 25/03159 375/232 |
| 2015/0058692 A1* | 2/2015 | Bennatan | H03M 13/1111 714/752 |
| 2016/0049962 A1* | 2/2016 | Li | H03M 13/1102 714/776 |
| 2016/0254937 A1* | 9/2016 | Bayesteh | H04L 1/0054 375/341 |
| 2017/0019222 A1* | 1/2017 | Ge | H04L 5/0007 |
| 2017/0111142 A1 | 4/2017 | He et al. | |
| 2017/0134048 A1* | 5/2017 | Inbar | H03M 13/1125 |
| 2017/0141798 A1* | 5/2017 | Kudekar | H03M 13/6527 |
| 2017/0238255 A1* | 8/2017 | Chari | H04L 1/0042 455/574 |
| 2018/0109269 A1* | 4/2018 | Richardson | H03M 13/1128 |

* cited by examiner

MESSAGE PASSING ALGORITHM DECODER AND METHODS

TECHNICAL FIELD

The present application relates to wireless communications and specifically, methods and systems for decoding data in a received signal.

BACKGROUND

Sparsely encoded wireless data may be decoded using techniques such as message passing algorithm (MPA). For a sparse code multiple access (SCMA) decoder, MPA is an iterative algorithm that infers the transmitted SCMA codewords by updating and passing messages representing the probabilities of each of the possible codewords from the associated codebook known by the receiver having been transmitted. Although MPA decoders may be less complex then maximum likelihood decoders, MPA decoder implementations may be resource intensive.

SUMMARY

According to one embodiment of the present disclosure, there is provided a device for decoding one or more sparsely encoded data sequences. The device includes a function node module configured to: determine at least one selected function node value based on a received wireless signal and at least one channel estimate associated with the received wireless signal; and send the at least one selected function node value to a variable node module for determining at least one selected variable node value. The at least one variable node module value is selected according to a schedule determined based on the received wireless signal and the at least one channel estimate.

According to one embodiment of the present disclosure, there is provided a method for decoding one or more sparsely encoded data sequences in a received wireless signal. The method includes determining at least one selected function node value based on the received wireless signal and at least one channel estimate associated with the received wireless signal; and providing the at least one selected function node value for a determination of at least one selected variable node value. The at least one variable node module value is selected according to a schedule determined based on the received wireless signal and the at least one channel estimate.

BRIEF DESCRIPTION OF THE DRAWINGS

Reference will now be made, by way of example, to the accompanying figures which show example embodiments of the present application, and in which.

Like reference numerals are used throughout the Figures to denote similar elements and features. Although aspects of the invention will be described in conjunction with the illustrated embodiments, it will be understood that it is not intended to limit the invention to such embodiments.

DETAILED DESCRIPTION OF EXAMPLE EMBODIMENTS

The present disclosure teaches methods, devices and systems for decoding data in a wireless network. Although described below with respect to sparse code multiple access (SCMA) systems, the present disclosure may also be applied to other sparsely encoded, codeword based systems.

SCMA is a coding technique that employs non-orthogonal multiplexing of code layers, resource overloading, and spreading over multiple subcarriers to enable multiple access through the use of different codebooks for different multiplexed layers. Such coding and multiple access techniques may be used to support greater amounts of data traffic in a wireless communications system as the demand for communications systems grows and as systems evolve, and as an increased number of machines or devices use wireless communications services. Specifically, SCMA data streams carry data encoded using a multidimensional codeword rather than a quadrature amplitude modulation (QAM) symbol mapping. The sparse codewords enable the use of receivers with a lower complexity algorithm, such as an iterative message passing algorithm (MPA) or an expectation propagation algorithm (EPA), for detecting codewords from the combined codewords received by the receiver.

Figure 1:
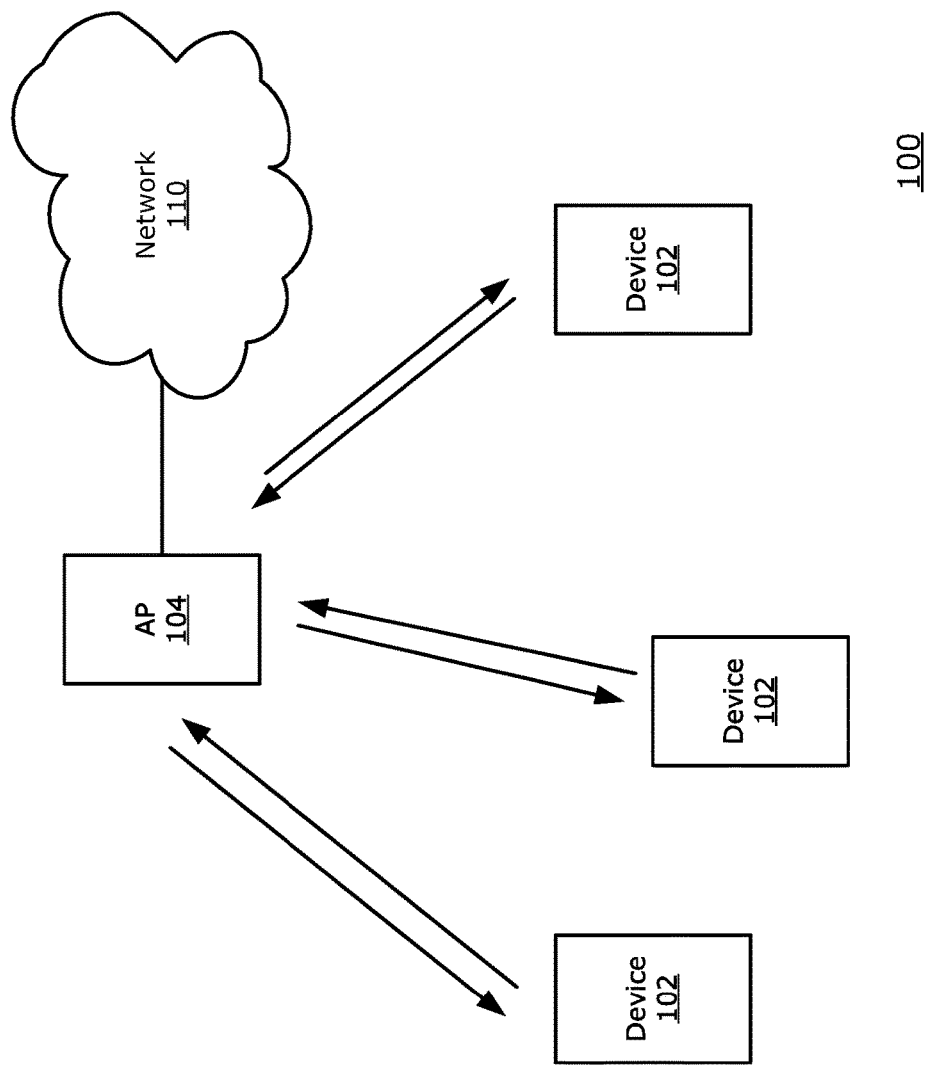
FIG. 1 is a block diagram illustrating an example communications system in accordance with one implementation of the present disclosure.

FIG. 1 illustrates a communications network 100 comprising a plurality of mobile devices 102, one or more access points (AP) 104. The network 100 may operate according to one or more communications or data standards or technologies including but not limited to fourth generation (4G) or future telecommunications networks, Long-Term Evolution (LTE), Universal Mobile Telecommunications System (UMTS), and other wireless or mobile communications networks. The term "mobile device" should be understood to mean any device capable of connecting to a mobile network via wireless communication, even if the device is not itself mobile. In LTE networks, a mobile device may be, for example, a user equipment (UE), wireless transmit/receive unit (WTRU), mobile station (MS), mobile terminal, smartphone, cellular telephone, sensor, or other wireless enabled device. In some embodiments, the mobile device 102 has the capability to send, receive, or send and receive data in the communications network 100. The access point 104 may comprise a base station (BS), evolved NodeB (eNB), or other network interface which functions as a wireless transmission and/or reception point for mobile devices 102 in the network 100. The access point 104 may be part of a centralized or cloud radio access network (C-RAN) and thus may make use of separate remote radio heads and baseband processing units (not shown). The access point 104 is connected to a backhaul network 110 which enables data to be exchanged between the access point 104 and other remote networks, nodes, access points, and devices (not shown). The access point 104 may support communications with each mobile device 102 by establishing uplink and downlink communications channels with each device 104, as represented by the arrows in FIG. 1. Communications in the network 100 may be unscheduled, scheduled by the access point 104 or by a scheduling or management entity (not shown) in the network 100, or a mix of scheduled and unscheduled communications. In networks 100 which support coordinated multi-point (CoMP) communications, multiple access points 104 may operate jointly as a virtual access point for a mobile device 102.

Figure 2:
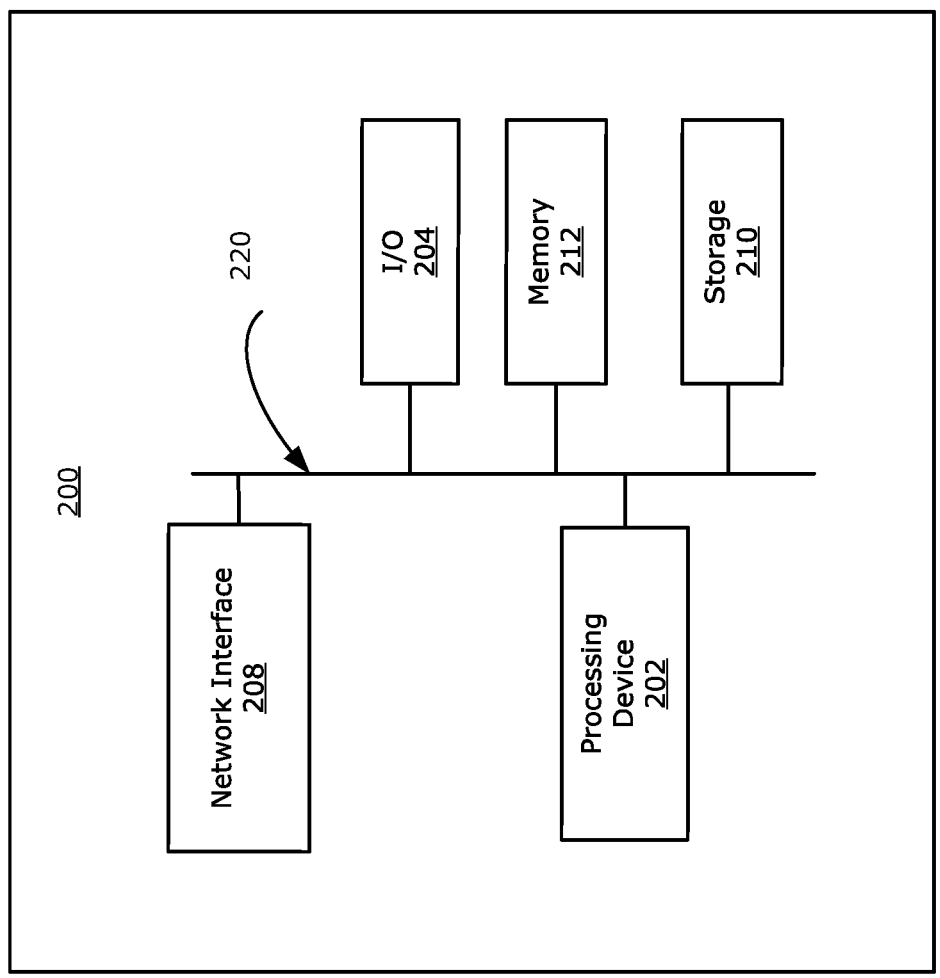
FIG. 2 is a block diagram illustrating an example processing system in accordance with one implementation of the present disclosure.

FIG. 2 illustrates an example processing system 200, which may be used to implement methods and systems described herein, such as the mobile device 102 or the access point 104. The processing system 200 may be a server or a mobile device, for example, or any suitable processing system. Other processing systems suitable for implementing the present disclosure may be used, which may include components different from those discussed below. Although FIG. 2 shows a single instance of each component, there may be multiple instances of each component in the processing system 200.

The processing system 200 may include one or more processing devices 202, such as a processor, a microprocessor, a many-core processor, an application-specific integrated circuit (ASIC), a field-programmable gate array (FPGA), a dedicated logic circuitry, or combinations thereof. The processing system 200 may also include one or more input/output (I/O) interfaces 204, which may enable interfacing with one or more appropriate input devices and/or output devices (not shown). One or more of the input devices and/or output devices may be included as a component of the processing system 200 or may be external to the processing system 200. The processing system 200 may include one or more network interfaces 208 for wired or wireless communication with a network, such as but not limited to, an intranet, the Internet, a P2P network, a WAN, LAN and/or a cellular or mobile communications network such as a 5G, 4G, LTE or other network as noted above. The network interfaces 208 may include wired links (e.g., Ethernet cable) and/or wireless links (e.g., one or more antennas) for intra-network and/or inter-network communications. The network interfaces 208 may provide wireless communication via one or more transmitters or transmit antennas, one or more receivers or receive antennas, and various signal processing hardware and software, for example. The network interfaces 208 may be configured for sending and receiving data to the backhaul network 110 or to other mobile devices, access points, network nodes, gateways or relays (not shown) in the network 100.

The processing system 200 may also include one or more storage units 210, which may include a mass storage unit such as a solid state drive, a hard disk drive, a magnetic disk drive and/or an optical disk drive. The processing system 200 may include one or more memories 212, which may include a volatile or non-volatile memory (e.g., a flash memory, a random access memory (RAM), and/or a read-only memory (ROM)). The non-transitory memories 212 may store instructions for execution by the processing devices 202, such as to carry out the present disclosure. The memories 212 may include other software instructions, such as for implementing an operating system and other applications/functions. In some examples, one or more data sets and/or modules may be provided by an external memory (e.g., an external drive in wired or wireless communication with the processing system 200) or may be provided by a transitory or non-transitory computer-readable medium. Examples of non-transitory computer readable media include a RAM, a ROM, an erasable programmable ROM (EPROM), an electrically erasable programmable ROM (EEPROM), a flash memory, a CD-ROM, or other portable memory storage.

There may be a bus 220 providing communication among components of the processing system 200, including the processing devices 202, I/O interfaces 204, network interfaces 208, storage units 210 and/or memories 212. The bus 220 may be any suitable bus architecture including, for example, a memory bus, a peripheral bus or a video bus.

Communications between mobile device 102 and the access point 104 in the network 100 may be implemented by encoding data to be transmitted using sparse encoding, for example SCMA encoding techniques. SCMA codewords are provided in a set of codebooks and are used for mapping binary data, such as data from an FEC encoder, directly to a multi-dimensional codeword. Each codebook is associated with a different layer so that multiple data streams may be communicated over shared physical resources in the network 100. Each layer or codebook may be associated with or assigned to a mobile device 102 in the network 100, such that the receiver of the mobile device 102 or the access point 104 has knowledge of the codebook used to encode transmitted data. It is also contemplated that in some embodiments, multiple layers may be assigned to the same mobile device, the same layer may be assigned to multiple mobile devices, or a mobile device may be assigned one or more layers for uplink and one or more different layers for downlink. On the downlink, the layer assignment can be signalled dynamically to the mobile device 102 such that the assignment for a given mobile device 102 may change from one frame to the next.

Figure 3:
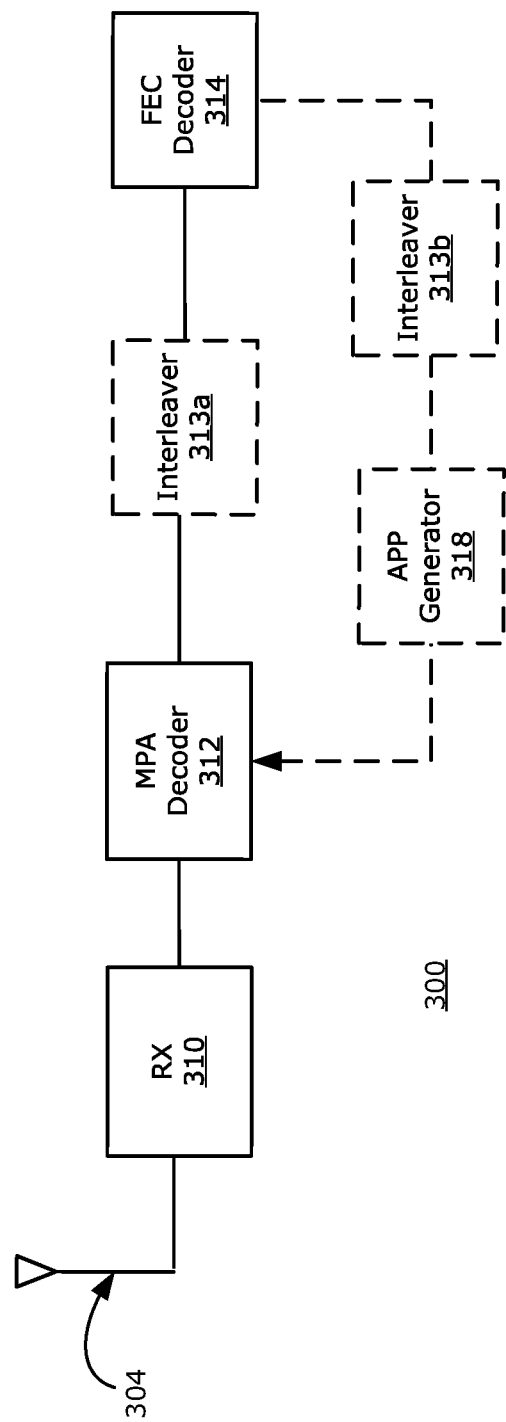
FIG. 3 is a block diagram illustrating a receiver in accordance with one implementation of the present disclosure.

New methods and systems are proposed for receiving SCMA encoded data and detecting codewords in the received signal. A block diagram of a portion of a receiver 300 according to one embodiment of the present disclosure is illustrated in FIG. 3. The receiver 300 may be part of a network interface 208 of the processing system 200 in a mobile device 102 or access point 104. The receiver 300 includes one or more antennas 304 and receive circuitry 310 to perform analog to digital conversions and filtering, or other processing of the received signal. It will be appreciated that the arrangement of elements in FIG. 3 is illustrative only and the receiver 300 may include multiple elements in different arrangements. The receiver 300 may support decoding of the received signal using an MPA or EPA.

In one embodiment, the receiver 300 includes an MPA decoder 312. The receive circuitry 310 provides the MPA decoder 312 with at least one received signal (y), at least one channel estimate (h), and at least one noise power estimate ($N_o$), for each resource element. In one embodiment, there is more than one channel estimate per received signal, but the number of noise power estimates is the same as the number of received signals. The MPA decoder 312 generates a set of log likelihood ratio values (LLRs) representing the inferred values of the transmitted bits being decoded. There will be a sub-set of LLRs for each active SCMA layer. The number of LLR values per set depends on the codebook in use for the corresponding SCMA layer. The LLRs from the MPA decoder 312 are further processed and decoded, by a forward error correction (FEC) decoder 314 and other circuitry to recover the encoded data sequences. The FEC decoder 314 may be a turbo decoder, a polar code decoder, or other type FEC decoder. In some embodiments, the receiver 300 includes an interleaver 313a between the MPA decoder 312 and the FEC decoder 314. In some embodiments, the receiver 300 includes an outer loop path where soft information such as LLRs are fed back from the FEC decoder 314 to the MPA decoder 312. In these embodiments, the FEC decoder 314 is a form of soft-input soft-output (SISO) FEC decoder. In some of these embodiments, the receiver 300 includes an interleaver 313b and a priori probability (APP) generator 318 in the path between the FEC decoder 314 and the MPA decoder 312.

Figure 4:
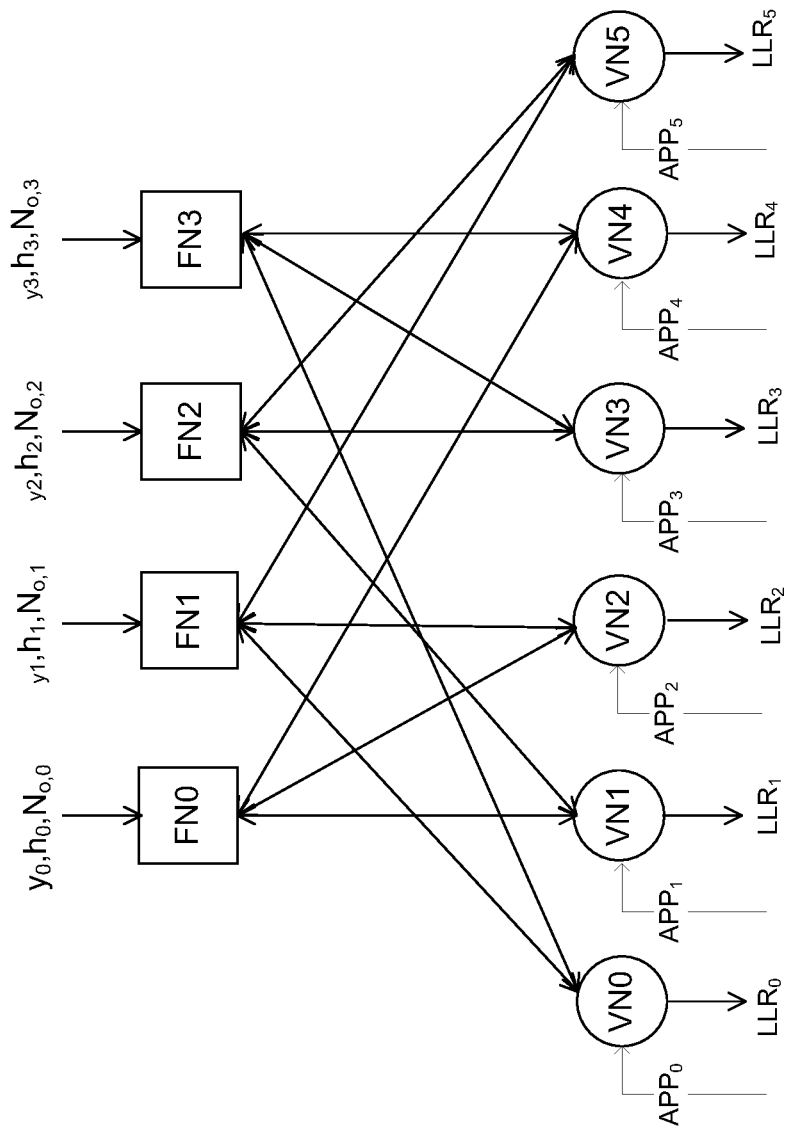
FIG. 4 illustrates a diagram of a factor graph representation of an SCMA decoder structure.

Initial calculations are performed to determine the conditional channel probabilities (CCPs) based on the received signal (y), channel estimate (h), and noise power ($N_o$), for each resource element. Then, inference of transmitted bits is done by use of a message passing algorithm (MPA) that exchanges and updates values or messages representing the probabilities that the received SCMA codeword being recovered is each of the M possible codewords in a SCMA codebook $C_k$. The relationship between SCMA codebooks spread across a number of resource elements (RE) or sub-carriers, and the MPA decoding process, may be represented by a bipartite graph or Tanner graph as illustrated in FIG. 4. The structure of the graph depends on a number of parameters of the SCMA system design. The graph in FIG. 4 represents an example SCMA system in which each codeword is spread over four physical resource elements (n=4), as represented by the four function nodes, FN0-FN3 as illustrated in FIG. 4. In the example SCMA system, six transmissions or layers are permitted at the same time based on six different codebooks. The six codebooks or layers are represented by variable nodes, VN0-VN5 as illustrated in FIG. 4. Based on the example codebook design, three VNs connect to each FN ($d_f$=3) and two FNs connect to each VN ($d_v$=2), with $d_v$ representing the number of non-zero elements in each codeword. Intuitively, this implies that within a codebook fitting FIG. 4, all codewords have the same two ($d_v$=2) elements that are non-zero. Further, at the receiver 300, when 6 codewords arrive together on the same 4 elements, there are only 3 ($d_f$=3) collisions per element. Each $FN_n$ represents the function relating the elements of the VNs that are on subcarrier n, $RE_n$, to the received signal $y_n$ on this RE. $VN_k$ represents the transmitted SCMA codeword using the codebook $C_k$. The connections between the VNs and FNs are referred to as "edges". The VNs generate outputs consisting of vectors of LLRs for each layer, and LLRs $LLR_0$ to $LLR_5$ for each bit being decoded. A priori probability (APP) information may be provided as an input $APP_0$-$APP_5$ for each VN0-VN5.

Typically, in existing systems, after a first determination of the CCPs is made, values or messages are passed and updated effectively in parallel from the FNs to the VNs, and then again effectively in parallel from the VNs to the FNs. The messages represent the probabilities that the transmitted SCMA codeword being decoded is each of the M possible codewords from the codebook $C_k$ based on messages arriving at the particular node. Messages are refined at each iteration of the decoder. When messages are passed from a particular $VN_k$ to its associated function nodes, these messages are based on the messages from the previous decoder iteration from all other FNs connected to the particular $VN_k$. When messages are passed from a particular $FN_n$ to its associated VNs, these messages are based on the messages from the previous decoder iteration from all other VNs connected to the particular $FN_n$. The exchanged messages are considered to contain extrinsic information because the sending node computes the messages with information from all connected nodes other than the destination node. Thus, in prior implementations, in one iteration all messages for the edges from the function nodes are updated and sent to the variable nodes then all messages for the edges from the variable nodes are updated and sent to the function nodes. The messages may be updated and passed in parallel for a number of iterations until a stopping condition is met. Thus, redundant processing resources are required for each node to support this parallel implementation. Where signals are received by a node in the network, such as the access point 104, the converged probability values are processed to determine each of the symbols for the codebooks associated with the transmitting mobile devices 102. Where signals are received by a node in the network, such as the mobile device 102, the converged probability values are processed to determine each of the symbols for the codebooks for the one or more layers associated with the mobile device 102. In many cases, additional layers must be decoded in order to decode the layers of interest. If all layers are decoded, a priori probabilities may be generated for all layers to improve decoding when using successive outer loops in the decoding process.

Figure 6:
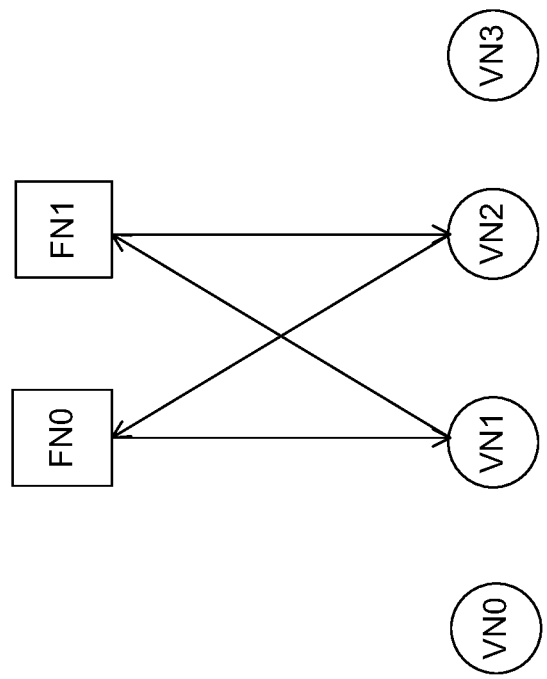
FIGS. 5 to 7 illustrate diagrams of factor graphs representing an SCMA code and message passing algorithm in accordance with one implementation of the present disclosure.
Figure 5:
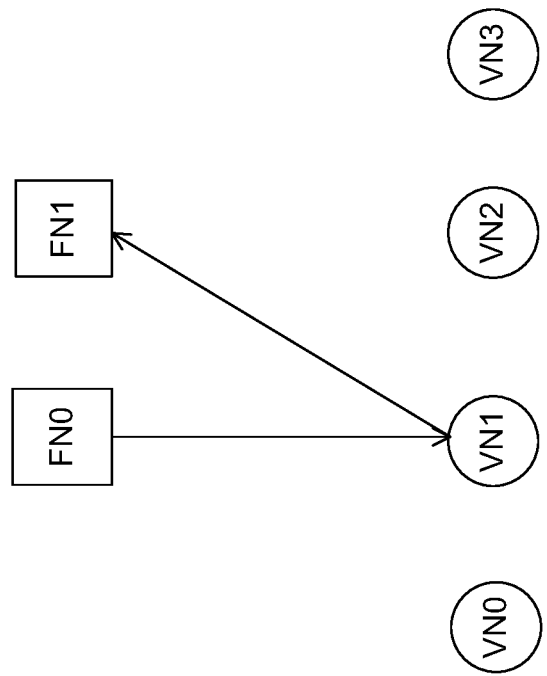
Figure 7:
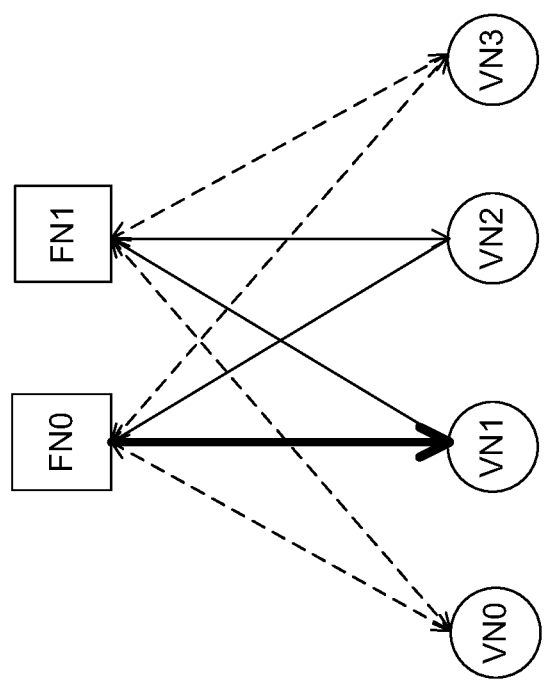

In contrast, in the proposed MPA decoder 312 and methods described below, early belief message propagation is used along with serial scheduling, rather than parallel updates, in order to update and propagate messages. The probability or belief message is immediately propagated in order to be available for use in the subsequent message update. Thus, messages are updated with information which would not normally be available until a later iteration. An example message flow is illustrated in FIGS. 5, 6 and 7 for an example set of SCMA codebooks where the codewords are spread across two resource elements (K=2), and four layers (J=4) are supported. The resource elements and layers are represented by the function nodes FN0-1 and variable nodes VN0-3, respectively. In one embodiment, starting with FIG. 5, at least one message or function node value for the edge from FN0 to VN1 is computed and propagated. Then, at least one message or variable node value is computed and propagated for the edge from VN1 to FN1. As shown in FIG. 6, at least one message for the edge from FN1 to VN2 is then computed and propagated. Thus, the values or messages determined for the edge from FN1 to VN2 are based on the updated belief information from VN1 earlier in the decoding process. At least one message is then computed and propagated for the edge from VN2 to FN0. As this continues, one or more messages for each edge are updated, and the current or most recent messages or variable node values determined for a $VN_k$ are made available and used in the next calculations for a selected associated function node, $FN_n$. In some embodiments, the second iteration starts again with the same schedule and messages for the edge from FN0 to VN1 being computed and propagated, as represented by the thick arrow in FIG. 7. Thus, messages may be computed and forwarded based on early belief information, rather than waiting for a parallel update of all nodes. The early belief propagation may provide higher quality early belief estimates for the detected codewords. Edges are bidirectional in that messages for a given edge which are determined by an FN go from the FN to the VN at the other end of the edge. Similarly, messages for a given edge which are determined by a VN go from the VN to the FN at the other end of the edge. It should be noted that this is a logical structure and does not actually require separate edges or nodes so long as the correct data is used for each operation. Latency of the serial implementation may also be reduced by the immediate propagation of belief messages which are used in subsequent messages updates.

The order and number of calculations to be performed may be determined by the MPA decoder 312 and represented as an MPA schedule. The order of calculations described above for FIGS. 5, 6 and 7 is just one example. Different orders of calculations may be used, even between iterations of the MPA for the same received signal. The scheduling of calculations may be determined based on factors which include, but are not limited to, knowledge of the codebook and waveform design of the particular SCMA system, channel quality including channel estimate values and noise power estimate values, and a priori probability (APP) values from the VNs. The scheduling may also take into account which ones of the available layers are currently active. The downlink channel may also have power offsets between layers. As a result, it may be beneficial to prioritize and start the schedule with messages for certain layers. For downlink communications from the access point 104 to the mobile device 102, for example, the MPA decoder 312 in the mobile device 102 may have knowledge of which layers and resource elements are being used for receiving data, and the scheduling of the serial decoding and propagation of messages may be determined based on this information. For uplink communications from one or more mobile devices 102 to an access point 104, the access point 104 may have less information about which resource elements may be active. The access point 104 may have information about the number of mobile devices 102 and associated codebooks potentially transmitting data. The scheduling of the serial decoding and propagation of messages for each layer may be determined based on this information.

Thus, some scheduling may be predetermined based on the SCMA system design, and some scheduling may be determined dynamically during operation based on factors such as channel quality. Additionally, the schedule may change dynamically based on the FN and VN values being propagated as iterations are performed to arrive at the final LLR outputs. In some MPA schedules, all messages for one FN may first be computed and propagated, followed by determining all messages for another FN. In other MPA schedules, all messages for a single edge at an FN, or just one message for the edge, is computed and propagated. The next message, or multiple messages for the same edge for the same FN, or a different FN, may be computed and propagated. Thus, new or updated messages are available for subsequent calculations in the schedule without waiting for an entire iteration of all messages to be determined and propagated. In some embodiments, the FN or VN and the particular edge and message selected for the next calculation in the schedule is based on a value from a respective VN or FN determined by the previous calculation. Thus, the next calculation in the schedule can take advantage of the updated belief information from the previous calculation. In some embodiments, some parallel updates may also be scheduled for one or more messages and one or more edges from FNs to VNs and/or from VNs to FNs. Thus, some parallelism may be used in combination with the serial implementation described in order to meet latency targets. In one embodiment, for example, all edges may first be updated and propagated in parallel for a particular FN, followed by scheduling and performing calculations in series for multiple VNs. In some embodiments, all messages for all edges between the FNs and VNs are calculated at least once before repeating calculations for any other edges.

Figure 8:
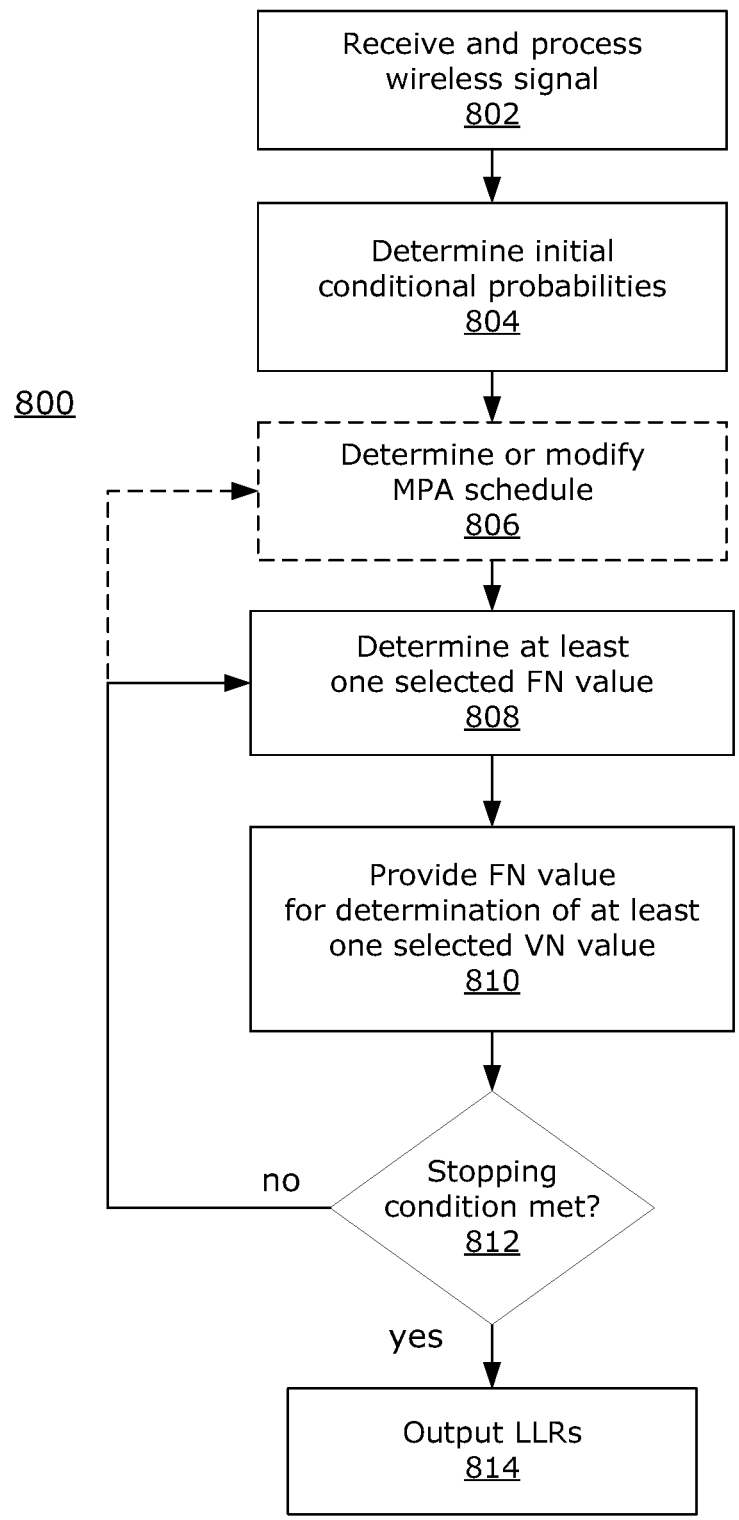
FIG. 8 is a block diagram of a method in accordance with one implementation of the present disclosure.

FIG. 8 illustrates a general view of the proposed decoding method 800. At step 802, wireless signals are first received and processed to obtain at least one received signal $y_n$, at least one channel estimate $h_n$, and at least one noise power $N_{o,n}$ value for each resource element (n). Depending on the link and receiver configuration, there may be multiple values of $y_n$, and $h_n$. The number of values of $y_n$, and $h_n$ depends on the number of active sources, antennas, and layers.

At step 804, conditional channel probabilities (CCPs) are determined for each FN based on the received signal $y_n$, channel estimate $h_n$, and noise power $N_{o,n}$ values.

Next, a series of calculations are performed with each calculation determining at least one new value or message for at least one edge in the factor graph representation. In some embodiments, an MPA schedule is determined at step 806, as described above, and the series of calculations are performed according to the MPA schedule. At least one selected FN value is determined at step 808. As described above, the possible set or number of values or messages for each edge corresponds to the number of possible codewords or data sequences in the system design. The at least one selected FN value determined at step 808 is provided at step 810 for the determination of at least one selected VN value. In further embodiments, the at least one selected VN value is determined and this VN value is provided for a determination of at least one selected FN value. Thus, each new message is available for use in a subsequent calculation in the MPA schedule without the need for all messages, edges and nodes in the factor graph to be determined and updated.

In some embodiments, depending on the codebook design, determining at least one value or message for at least one edge for an FN or VN may include storing the determined value in a memory which is associated with, or part of, the FN or VN. The memory may be any suitable structure for storing the determined value, such as a register bank. The series of calculations is executed according to the MPA schedule, as described above. A number of calculations and iterations may be performed until a stopping condition is met at step 812. The stopping condition may include one or more criteria such as a maximum iteration count, or a sufficient quality of the estimated codeword being reached. If the stopping condition is not met, steps 808 and 810 are repeated and at least one selected FN value is determined and provided for a determination of at least one selected VN value. In some embodiments, if the stopping condition is not met, the MPA schedule may be modified at step 806 based on the selected FN values and/or VN values which have been determined.

Once the stopping condition is met, the probability determination of the codeword at each layer is used to determine the LLR for each bit. The LLR values are output at step 814 to the FEC decoder 314 in FIG. 3. In some embodiments, the LLR values may be output before the stopping condition is met. The LLR values may be determined and stored in a memory and overwritten until the stopping condition is met.

When the message passing algorithm is run, a priori probability information may be used for the $VN_k$ messages. In some embodiments, this a priori probability information is provided as feedback from the FEC decoder 314, or from the APP generator 318. In some embodiments, at the start of the method 800, the a priori probability information may be assumed to be equal for each codeword.

With the propagation of early belief information, the MPA decoder 312 may use a serial implementation in hardware. This implementation allows for some reuse of operations and components which reduces the footprint and power requirements compared to a decoder employing a parallel message update scheme. In some embodiments, the MPA decoder 312 may be partitioned and implemented on low power, many-core processing devices 202 which may be suitable for particular mobile devices 102 and device to device or machine communications.

Figure 9:
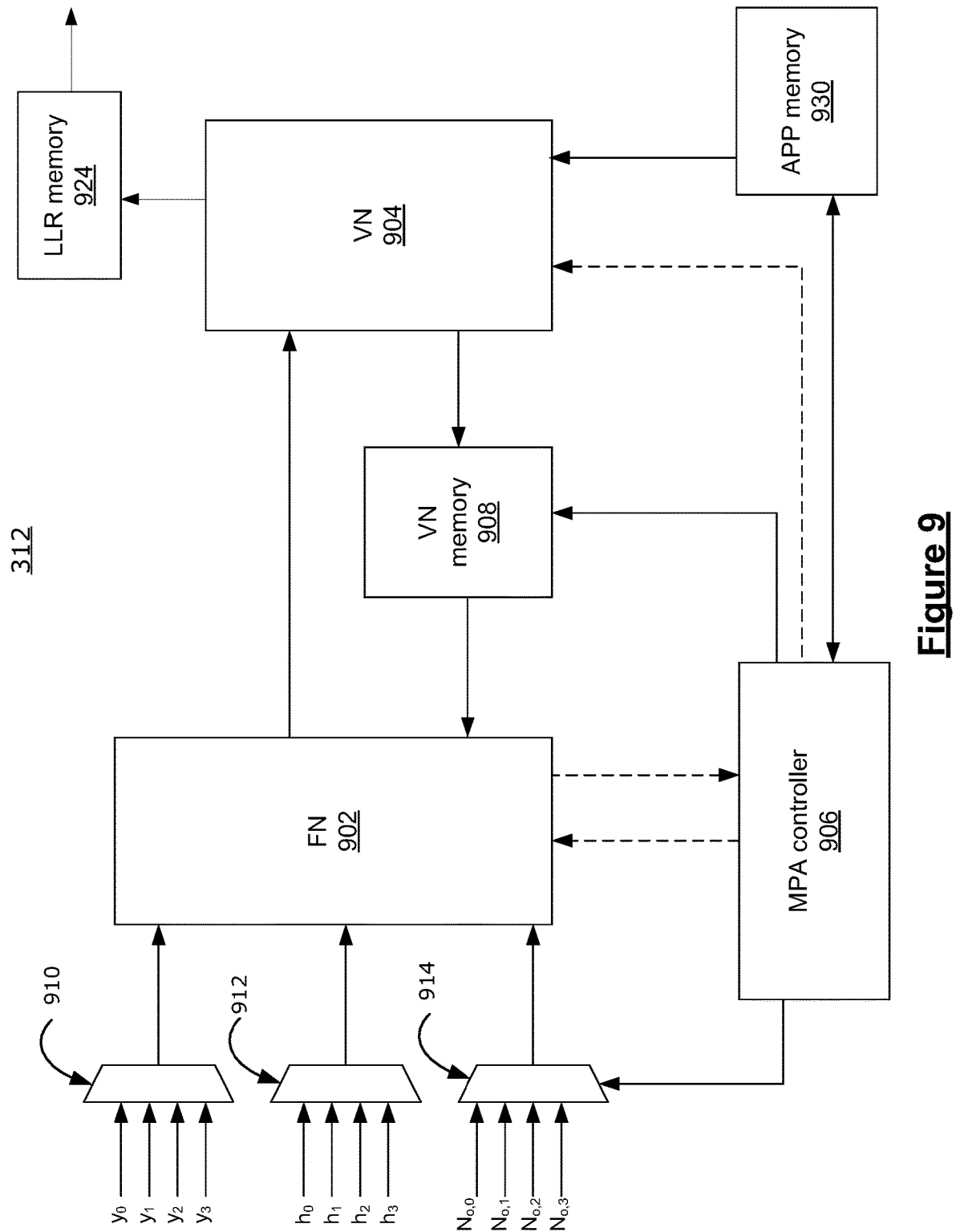
FIG. 9 is a block diagram of a portion of a decoder in accordance with one implementation of the present disclosure.

FIG. 9 is a block diagram illustrating one example implementation of components of the MPA decoder 312. The components correspond to an implementation supporting SCMA codebooks that spread over four resource elements. The example implementation in FIG. 9 is also based on a single input single output (SISO) interface for the MPA decoder 312. Each node includes logic elements or circuitry configured to determine the respective equations of the message passage algorithm for each FN module 902 or VN module 904 based on the MPA schedule generated and executed by an MPA controller 906. In some embodiments, the FN module 902 provides comparison information regarding the at least one received signal, at least one channel estimate and at least one noise estimate to the MPA controller 906. The MPA controller 906 may use the comparison information in generating the MPA schedule. In other embodiments (not shown), the MPA controller may receive the channel estimate and noise estimate information for use in generating the MPA schedule.

The FN module 902 determines the CCPs and also new function node values which are then available for use at the VN module 904. A variable node memory 908 is used to store current variable node output values as they are determined and updated by the VN module 904. Thus, current variable node values or messages are available for the FN module 902 from the VN memory 908 as soon as they are written. For an MPA decoder 312 supporting codebook designs which include more than 2 edges per VN, an FN memory (not shown) may also be included.

As shown, the received signal $y_n$, channel estimate $h_n$, and noise power $N_{o,n}$ inputs for each resource element (n) are selected by the MPA controller 906 for the FN module 902 through multiplexers 910, 912, 914 to compute the CCPs. It will be appreciated that in some embodiments, for a Single Input Multiple Output (SIMO) system there will be a set of inputs for each receive antenna. The channel estimates ($h_n$) may be vectors if there are multiple channel estimates for each resource element. Multiple mobile devices 102 using different codebooks but the same resource elements can have signals that pass through different channels before reaching the access point 104. In one embodiment, the circuit includes an MPA controller 906 which controls the multiplexers 910, 912, 914 and other components as described herein. The MPA controller 906 may be part of the network interface 208 in the system 200 or it may be implemented in a separate processing device 202. The MPA controller 906 may operate to control multiple similar FN modules, VN modules, multiplexer components and memories for multiple MPA decoders 312 according to different MPA schedules.

The MPA controller 906 also is configured to select the current variable node values provided to the FN module 902 from the VN memory 908. Thus, through the selection of the inputs from the multiplexers 910, 912, 914 and messages from the VN memory 908, the series of calculations may be scheduled or controlled by the MPA controller 906. In one embodiment, the FN module 902 and VN module 904 are configured to perform calculations based on the inputs controlled by the MPA controller 906. In other embodiments, the FN module 902 and/or the VN module 904 are configured to perform some of the functions of the MPA controller 906. Once the series of calculations is completed for a number of iterations and the stopping condition is met, the last values from the VN module 904 are provided as an output representing the probabilities for a detected data sequence or codeword for a particular layer. In one embodiment, the probability values are converted to LLR values and stored in an LLR memory 924. As described above, the LLR values are provided to the FEC decoder 314 for further decoding and processing.

In one embodiment, as described above, a priori probability information is provided to the VN module 904, such as from an a priori probability (APP) memory 930. The APP memory 930 may also be controlled by the MPA controller 906 which selects the information provided from the APP memory 930 to the VN module 904. In some embodiments, the APP memory 930 is updated with a priori probability information or feedback from other parts of the receive circuitry. The a priori probability information may be provided by the FEC decoder 314 or by the APP generator 318. In some embodiments, the MPA controller 906 may also receive feedback from other parts of the receive circuitry, such as from the FEC decoder 314, which may be used to modify the scheduling of the series of function node and variable node calculations.

It will be appreciated that the components illustrated in the example of FIG. 9 may be repeated, scaled or configured within the MPA decoder 312 in order to accommodate the design parameters of the data sequences and number of layers of data being transmitted at the same time in a multiple access system. The MPA decoder 312 thus may be implemented in a processing system 200 for a mobile device 102 which typically may receive one or more layers of data from the access point 104. The MPA decoder 312 may also be implemented in a processing system 200 for an access point 104 and configured to detect data sequences for multiple layers received by the access point 104 from multiple mobile devices 102.

The present disclosure provides certain example algorithms and calculations for implementing examples of the disclosed methods and systems. However, the present disclosure is not bound by any particular algorithm or calculation.

Although the present disclosure describes methods and processes with steps in a certain order, one or more steps of the methods and processes may be omitted or altered as appropriate. One or more steps may take place in an order other than that in which they are described, as appropriate.

Through the descriptions of the preceding embodiments, the present invention may be implemented by using hardware only, or by using software and a necessary universal hardware platform, or by a combination of hardware and software. Based on such understandings, the technical solution of the present invention may be embodied in the form of a software product. The software product may be stored in a non-volatile or non-transitory storage medium, which can be a compact disk read-only memory (CD-ROM), USB flash drive, or a hard disk. The software product includes a number of instructions that enable a computer device (personal computer, server, or network device) to execute the methods provided in the embodiments of the present invention.

Although the present invention and its advantages have been described in detail, it should be understood that various changes, substitutions and alterations can be made herein without departing from the invention as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

The invention claimed is:

1. A device for iteratively decoding one or more sparsely encoded data sequences, the device comprising:
 a function node module for implementing a plurality of function nodes; and
 a variable node module for implementing a plurality of variable nodes;
 the function node module being configured to, in a given iteration:
  determine a first function node value, for a first selected function node, based on a received wireless signal and at least one channel estimate associated with the received wireless signal; and
  send the first function node value to the variable node module;
 the variable node module being configured to, in the given iteration:
  determine a first variable node value, for a first selected variable node, based on the first function node value;
  the first variable node being selected according to a schedule for the given iteration, the schedule being determined based on the received wireless signal and the at least one channel estimate; and
  send the first variable node value to the function node module;
 wherein the first variable node value is used by the function node module to determine, within the given iteration, a second function node value for a second selected function node;
 the second function node being selected according to the schedule for the given iteration.

2. The device of claim 1 wherein the schedule is determined based on the received wireless signal, the at least one channel estimate and at least one noise estimate associated with the received wireless signal.

3. The device of claim 2 wherein the function node module is configured to determine at least one conditional channel probability (CCP) based on the received wireless signal, the at least one channel estimate and the at least one noise power estimate, and wherein the function node module is configured to determine the first function node value based on the at least one CCP.

4. The device of claim 1 wherein the function node module and the variable node module are configured to iteratively determine function node values and variable node values according to the schedule until a stopping condition is met.

5. The device of claim 1 wherein the second function node value is determined according to a message passing algorithm (MPA) calculation that maps variable node values to the second function node value, and wherein the first variable node value is determined according to an MPA calculation that maps function node values to the first variable node value.

6. The device of claim 1 further comprising a controller configured to determine the schedule, wherein the function node module is configured to send comparison information of a plurality of channel estimates and a plurality of noise estimates to the controller.

7. The device of claim 6 wherein the controller is further configured to determine the schedule based on the comparison information, an encoding scheme and waveform design for the sparsely encoded data sequences, a priori probability values, additional channel quality information, or combinations thereof.

8. The device of claim 6 wherein the controller is configured to determine the schedule for a plurality of message passing algorithm (MPA) calculations that map variable node values to function node values and for a plurality of MPA calculations that map function node values to variable node values.

9. The device of claim 8 wherein the controller is configured to modify the schedule for each iteration of the MPA.

10. The device of claim 9 wherein the controller is configured to modify the schedule for each iteration of the MPA based on one or more codebooks used to generate the one or more sparsely encoded data sequences, waveform design, the at least one channel estimate, at least one noise power estimate, a priori probability (APP) values, identification of one or more active layers and the codebook associated with each layer, power offsets between the active layers, one or more function node values, one or more variable node values, or a combination thereof.

11. The device of claim 1 wherein the sparsely encoded data sequences include sparse code multiple access (SCMA) codewords.

12. The device of claim 1, wherein the function node module is further configured to:
 determine, within the given iteration, the second function node value, for the second selected function node, based on the first variable node value; and
 send the second function node value to the variable node module, for determining a second variable node value for a second selected variable node;
 the second variable node being selected according to the schedule for the given iteration.

13. The device of claim 1, wherein the schedule is further determined based on at least one determined value for at least one function node or variable node.

14. A method for iteratively decoding one or more sparsely encoded data sequences in a received wireless signal, the method comprising:
 in a given iteration:
  determining a first function node value, for a first selected function node, based on the received wireless signal and at least one channel estimate associated with the received wireless signal;
  determining a first variable node value, for a first selected variable node, based on the first function node value;
  the first variable node being selected according to a schedule for the given iteration, the schedule being determined based on the received wireless signal and the at least one channel estimate; and
  determining, within the given iteration, a second function node value, for a second selected function node, using the first variable node value;
  the second function node being selected according to the schedule for the given iteration.

15. The method of claim 14 further comprising determining the schedule based on the received wireless signal, the at least one channel estimate and at least one noise estimate associated with the received wireless signal.

16. The method of claim 15 further comprising determining the schedule based on the received wireless signal, a plurality of channel estimates, a plurality of noise estimates, an encoding scheme and waveform design for the sparsely encoded data sequences, a priori probability values, additional channel quality information, or combinations thereof.

17. The method of claim 14 further comprising iteratively determining function node values and variable node values according to the schedule until a stopping condition is met.

18. The method of claim 14 further comprising first determining at least one conditional channel probability (CCP) based on the received wireless signal, the at least one channel estimate and the at least one noise estimate, and determining the at least one function node value based on the at least one CCP.

19. The method of claim 18 further comprising determining the second function node value according to a message passing algorithm (MPA) calculation that maps variable node values to the second function node value and determining the first variable node value according to an MPA calculation that maps function node values to the first variable node value.

20. The method of claim 14 wherein the sparsely encoded data sequences include sparse code multiple access (SCMA) codewords.

* * * * *